(12) United States Patent
Schloesser et al.

(10) Patent No.: US 11,145,745 B2
(45) Date of Patent: Oct. 12, 2021

(54) METHOD FOR PRODUCING A SEMICONDUCTOR COMPONENT

(71) Applicant: Infineon Technologies AG, Neubiberg (DE)

(72) Inventors: Till Schloesser, Munich (DE); Christian Kampen, Munich (DE); Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 16/514,292

(22) Filed: Jul. 17, 2019

(65) Prior Publication Data
US 2020/0027969 A1 Jan. 23, 2020

(30) Foreign Application Priority Data

Jul. 18, 2018 (DE) .......................... 102018117369.5
Apr. 5, 2019 (DE) .......................... 102019109048.2

(51) Int. Cl.
*H01L 21/02* (2006.01)
*H01L 29/66* (2006.01)
*H01L 29/06* (2006.01)

(52) U.S. Cl.
CPC .. *H01L 29/66734* (2013.01); *H01L 21/02587* (2013.01); *H01L 29/0634* (2013.01)

(58) Field of Classification Search
None
See application file for complete search history.

(56) References Cited

U.S. PATENT DOCUMENTS

| | | |
|---|---|---|
| 2005/0181564 A1 | 8/2005 | Hshieh et al. |
| 2013/0161742 A1 | 6/2013 | Cho et al. |
| 2014/0120669 A1* | 5/2014 | Eguchi ................ H01L 29/7813 438/269 |
| 2017/0154956 A1 | 6/2017 | Weber et al. |

FOREIGN PATENT DOCUMENTS

| | | |
|---|---|---|
| DE | 102010060229 A1 | 5/2011 |
| DE | 112013005837 T5 | 8/2015 |

OTHER PUBLICATIONS

Okubo, Hisanori, et al., "Ultralow On-Resistance 30-40 V UMOSFET by 2-D Scaling of Ion-Implanted Superjunction Structure", Proceedings of the 25th International Symposium on Power Semiconductor Devices & ICs, Kanazawa, 2013, pp. 87-90.

* cited by examiner

*Primary Examiner* — Bradley Smith
(74) *Attorney, Agent, or Firm* — Murphy, Bilak & Homiller, PLLC

(57) ABSTRACT

A method for producing a semiconductor component includes: providing a semiconductor body having a first dopant of a first conductivity type; forming a first trench in the semiconductor body starting from a first side; filling the first trench with a semiconductor filler material; forming a superjunction structure by introducing a second dopant of a second conductivity type into the semiconductor body, the semiconductor filler material being doped with the second dopant; forming a second trench in the semiconductor body starting from the first side; and forming a trench structure in the second trench.

21 Claims, 13 Drawing Sheets

METHOD FOR PRODUCING A SEMICONDUCTOR COMPONENT

TECHNICAL FIELD

The application relates to a method for producing a semiconductor component.

BACKGROUND

In semiconductor components with field effect transistors in the reverse voltage range of from a few tens of volts to a few hundred volts, field plate trench field effect transistors are for example used. Improvement of the area-specific on-state resistance Ron×A is the subject of further development of such field effect transistors. In this case, for example, compromises are to be made in the required component properties, since the variation of one component parameter may have a different effect on the component properties, for example may lead to an improvement in one component property with a simultaneous deterioration of another component property. For example, an increase in the dopant concentration in the drift zone may lead to a desired reduction of the area-specific on-state resistance Ron×A, but may entail an undesired reduction of the voltage blocking ability between source and drain. Against this background, this application relates to a method for producing a field effect transistor with an improved specific on-state resistance Ron×A.

SUMMARY

The present disclosure relates to a method for producing a semiconductor component. The method comprises provision of a semiconductor body, which comprises a first dopant of a first conductivity type. The method also comprises formation of a first trench in the semiconductor body as well as filling of the first trench with a semiconductor filler material. The method furthermore comprises formation of a superjunction structure by introducing a second dopant of a second conductivity type into the semiconductor body, the semiconductor filler material being doped with the second dopant. The method further comprises formation of a second trench in the semiconductor body as well as formation of a trench structure in the second trench.

Those skilled in the art will recognize additional features and advantages upon reading the following detailed description, and upon viewing the accompanying drawings.

BRIEF DESCRIPTION OF THE DRAWINGS

The accompanying drawings serve for the understanding of exemplary embodiments of the invention, are included in the disclosure and form a part thereof. The drawings merely illustrate exemplary embodiments and serve, together with the description, for the understanding thereof. Further exemplary embodiments and many of the intended advantages may emerge directly from the detailed description below. The elements and structures shown in the drawings are not necessarily represented true-to-scale with respect to one another. References which are the same refer to elements and structures which are the same or correspond to one another.

DETAILED DESCRIPTION

In the following detailed description, reference is made to the accompanying drawings, which form a part of this disclosure and in which specific embodiments are shown for illustration purposes. In this regard, direction terminology such as "upper side", "bottom", "front side", "rear side", "forward", "backward", "front", "rear", etc. refers to the alignment of the figures being described. Since the component parts of exemplary embodiments may be positioned in different orientations, the direction terminology serves only for explanation and is in no way to be regarded as limiting.

It is to be understood clearly that there are further exemplary embodiments, and structural or logical modifications may be made to the exemplary embodiments without deviating from what is defined by the patent claims. The description of the exemplary embodiments is to this extent not limiting. In particular, elements of exemplary embodiments described below may be combined with elements of other of the exemplary embodiments described, if the context does not dictate otherwise.

The terms "have", "contain", "comprise", "include" and the like are open terms in what follows, which on the one hand indicate the presence of the elements or features mentioned, but on the other hand do not exclude the presence of further elements or features. The indefinite article and the definite article encompass both the plural and singular, unless the context clearly dictates otherwise.

The term "electrically connected" describes a permanent low-ohmic connection between electrically connected elements, for example direct contact between the relevant elements or a low-ohmic connection via a metal and/or a heavily doped semiconductor. The term "electrically coupled" includes the possibility that there may be one or more intermediate elements, which are suitable for signal transmission, between the electrically coupled elements, for example elements which are controllable in order at different times to provide a low-ohmic connection in a first state and high-ohmic electrical decoupling in a second state.

Insulated gate field effect transistors (IGFETs) are voltage-controlled components such as metal oxide semiconductor FETs (MOSFETs). The term MOSFET also includes FETs with gate electrodes based on doped semiconductor material and/or gate dielectrics which are not, or not exclusively, based on an oxide.

Figure 1:
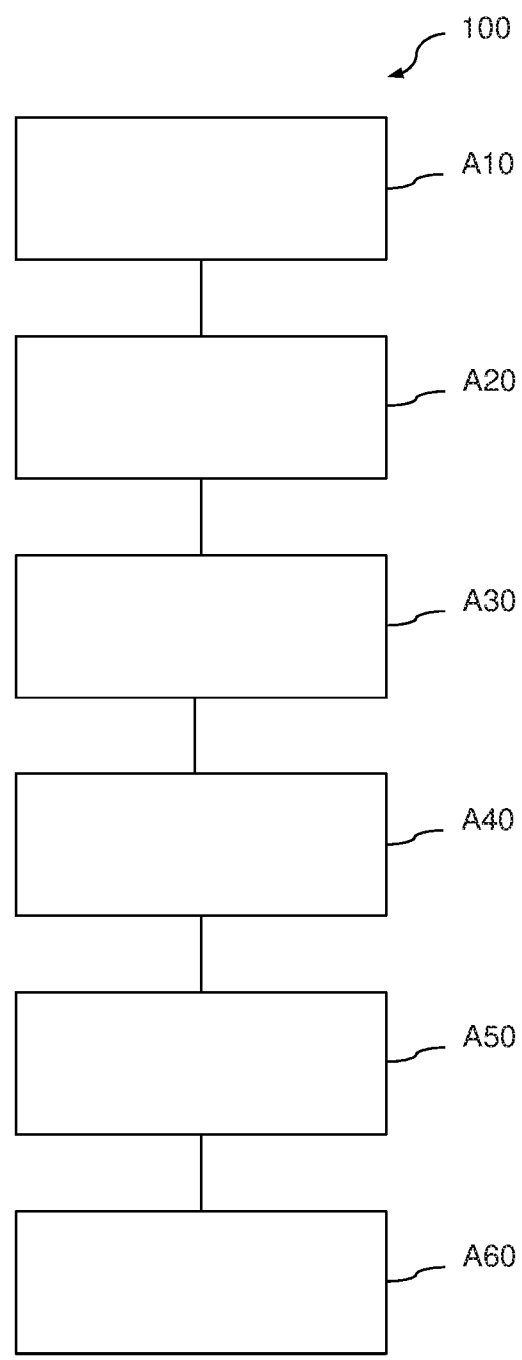
FIG. 1 shows a schematic flowchart to illustrate an exemplary method for producing a semiconductor component.

FIG. 1 represents a schematic flowchart 100 for the production of a semiconductor component according to one exemplary embodiment.

The flowchart 100 comprises method features which may respectively have one or more processing steps. During production of the semiconductor component, further processing steps may follow, for example before, between or alternatively after the method features shown. Likewise, further processing steps may be carried out between the processing steps assigned to one method feature or alternatively together with the processing steps described. For example, a processing step, which is assigned to one method feature, of forming a trench by means of a mask, may comprise an etching process which forms both the trench described and further trenches defined by means of the mask. Also, processing steps of various method features may be carried out together or in a different order.

A method feature A10 comprises provision of a semiconductor body, which comprises a first dopant of a first conductivity type. The term "first dopant of a first conductivity type" denotes a first dopant species of a first conductivity type, for example boron for the case in which the first conductivity type is a p-type. The first dopant is present in the semiconductor body as a multiplicity of individual elements of the dopant species of a first conductivity type, for example a multiplicity of boron atoms. Of course, the first conductivity type may also be an n-type, in which case phosphorus or arsenic represent exemplary dopant elements.

The semiconductor body may for example comprise a semiconductor substrate, for example a wafer of a monocrystalline semiconductor material, for instance silicon (Si), silicon-germanium (SiGe), silicon carbide (SiC) or alternatively a III-V semiconductor material. The semiconductor material may furthermore comprise no, one or alternatively a plurality of semiconductor layers, which are for example formed on the semiconductor substrate. The first dopant may for example be introduced into the semiconductor body by ion implantation, by diffusion from a diffusion source or alternatively by in-situ doping during layer deposition. Of course, a plurality of diffusion steps or alternatively ion implantation steps or alternatively a combination of diffusion and ion implantation steps may respectively be used in order to introduce the first dopant. A depth distribution of the first and second dopants may, for example, be achieved by ion implantations with different energies, or alternatively by a method in which epitaxy and implantation alternate repeatedly (so-called "multi-epi/multi-implant" method).

A method feature A20 comprises formation of a first trench in the semiconductor body starting from a first side. The first side may for example be a front side of the semiconductor component to be manufactured, for example the side on which a subsequent load terminal, such as a source terminal, and a subsequent control terminal, such as a gate terminal, are formed. The first trench may for example be formed with an etching process or a combination of a plurality of etching processes, for example a physical dry etching method, a chemical dry etching method, a physicochemical dry etching method such as reactive ion etching (RIE) or alternatively a wet etching method. The etching process may, for example, be carried out by means of a photolithographically produced etching mask. Since the etching of the first trench is used for the subsequent formation of a superjunction (SJ), a depth of the first trench may for example be adjusted as a function of a target voltage class of the semiconductor component to be achieved in the semiconductor body with the SJ structure.

A method feature A30 comprises filling of the first trench with a semiconductor filler material, for example carried out after the method feature A20. The semiconductor filler material may, for example, be produced by a layer deposition method such as chemical vapor deposition (CVD). For example, the first trench is filled with the semiconductor filler material by a method which allows filling with a maximally high crystal quality, for example epitaxial growth of the side and bottom surfaces of the first trench. A total dopant concentration in the semiconductor filler material may, as an average value determined over the vertical extent of the first trench, be more than two, or more than three or even more than four orders of magnitude less than a corresponding total dopant concentration in an area of the semiconductor body located next to the first trench in relation to the same vertical extent. The semiconductor filler material may therefore be an intrinsic semiconductor filler material, i.e. one which is doped only by impurities but not deliberately, or a semiconductor filler material which is deliberately lightly doped.

A method feature A40 comprises formation of a superjunction (SJ) structure by introducing a second dopant of a second conductivity type into the semiconductor body, the second dopant partially compensating for a concentration of the first dopant. The term "second dopant of a second conductivity type" denotes a second dopant species of a second conductivity type, for example phosphorus or arsenic for the case in which the second conductivity type is an n-type. The second dopant is present in the semiconductor body as a multiplicity of individual elements of the dopant species of the second conductivity type, for example as a multiplicity of phosphorus atoms. Of course, the first conductivity type may also be a p-type, in which case boron represents an exemplary dopant element.

The SJ structure is formed, by introducing the second dopant, in such a way that the intrinsically or lightly doped semiconductor filler material assumes the second conductivity type as a result of the doping with the second dopant, and the region of the semiconductor body which surrounds the semiconductor filler material and is of the first conductivity type because of the first dopant is merely partially compensated for in doping by the doping with the second dopant or is protected from partial compensation by a mask. If the semiconductor filler material which is to with the second dopant is used as a subsequent drift zone of an SJ semiconductor component, in view of the at least partially lacking doping compensation in the semiconductor filler material, there is improved charge mobility in comparison with the surrounding region of the semiconductor body, since no scattering takes place on a dopant that merely leads to doping compensation. The doping compensation in the surrounding region is uncritical, however, since this region is not used for carrying the load current in the subsequent semiconductor component, but is merely depleted of charge carriers as a charge compensation region.

A method feature A50 comprises formation of a second trench in the semiconductor body starting from the first side. The second trench may for example be formed, like the first trench, with one or a combination of a plurality of etching processes, for example a physical dry etching method, a chemical dry etching method, a physicochemical dry etching method such as reactive ion etching (RIE) or alternatively a wet etching method.

A method feature A60 comprises formation of a trench structure in the second trench. The formation of the trench structure may for example comprise the formation of a gate dielectric in the second trench, for example by thermal oxidation and/or deposition of an oxide such as TEOS (tetraethyl orthosilicate), and also the formation of a gate electrode in the second trench, for example by deposition of doped polycrystalline silicon. The trench structure may therefore, for example, be configured as a gate trench structure of an IGFET.

The method according to the flowchart 100 makes it possible to produce SJ IGFETs of small lateral dimensions with moderate process complexity. Thus, the SJ structure may for example be dimensioned merely by lithographically defined trench etching, without having to resort to further lithographic levels for definition of the SJ structure in the cell field.

According to one exemplary embodiment, the first dopant is introduced into the semiconductor body by a plurality of ion implantations with different implantation energies or by in-situ doping. Ion implantation allows flexible configuration of a doping profile extending into the depth of the semiconductor body by variation of energy and dose.

According to one exemplary embodiment, the first dopant is introduced into the semiconductor body by a plurality of ion implantations with different implantation energies, in such a way that a spacing of the neighboring implantation peaks in a vertical direction lies in a range of from 100 nm to 400 nm. In this way, as a result of the thermal budget during production of the semiconductor component, a waviness of the doping profile along the vertical direction may be reduced or even largely suppressed.

According to one exemplary embodiment, a maximum implantation energy and a minimum implantation are selected in such a way that a vertical spacing of the associated implantation peaks lies in a range of from 1 μm to 3 μm. This makes it possible, with a typical average doping concentration of from $10^{16}$ cm$^{-3}$ to $5\times10^{18}$ cm$^{-3}$, to produce SJ semiconductor components in the voltage class range of from several tens of volts to a few hundred volts.

According to one exemplary embodiment, a non-doping element is introduced into the semiconductor body in addition to the first dopant. The non-doping element is adapted to reduce diffusion of the first dopant due to a thermal budget. This makes it possible to establish the lateral extent of the regions of the SJ structure by the dimensioning of the first trench. If boron is selected as the first dopant, for example, carbon as a non-doping element may for instance counteract diffusion of the boron and restrict a p-column of the SJ structure to a region between neighboring first trenches. For example, carbon may be introduced into the semiconductor body by in-situ doping, for example together with the first dopant. As an alternative or in addition, carbon may be introduced into the semiconductor body by one or more ion implantations. Ion implantation allows flexible configuration of a carbon profile extending into the depth of the semiconductor body by variation of energy and dose. Carbon may likewise be introduced into the semiconductor body by one or more oblique implantations, for example by oblique implantations into side walls of the first trench before the filling of the first trench. In this way, for example, a diffusion barrier lining the first trench may be formed.

According to one exemplary embodiment, the second dopant is introduced fully, i.e. without masking, through a surface of an active transistor cell area by a plurality of ion implantations with different implantation energies. In this case, masking of the ion implantation may be carried out, for example in a peripheral area adjacent to the transistor cell area. Besides the second dopant, for example, carbon may additionally be introduced fully, i.e. without masking, through the surface of an active transistor cell area by one or more plurality of ion implantations.

According to one exemplary embodiment, the first dopant is introduced fully, i.e. without masking, through a surface of an active transistor cell area by a plurality of ion implantations with different implantation energies. The SJ structure may therefore be established merely by the dimensioning of the first trench, without the need for the first and second dopants, which form the SJ structure, to be introduced into the transistor cell field with the masking. As in the case of the ion implantations of the second dopant, masking of the ion implantation, for example in a peripheral area adjacent to the transistor cell area, may also be carried out during the ion implantation of the first dopant.

According to one exemplary embodiment, the superjunction structure comprises a first region of the first conductivity type, in which there is partial compensation for the doping of the first dopant by the second dopant, and a neighboring second region of the second conductivity type, which comprises the semiconductor filler material and is doped with the second dopant, a dose of the first dopant measured along a segment, which passes fully through the first region and the second region in a first lateral direction, differing by at most 5% from a dose of the second dopant along the same segment. The first lateral direction may in this case, for example in a semiconductor component having strip-shaped gate structures/transistor cells, extend perpendicularly to these strips. The charges which are due to the first dopant and the second dopant therefore cancel one another out approximately or even exactly.

According to one exemplary embodiment, a width of the second trench along the first lateral direction is less than a width of the second region along the first lateral direction. The semiconductor filler material in the second region may therefore adjoin side walls of the second trench. This allows a reliable channel connection to a drift zone during subsequent formation of a gate structure in the second trench.

According to one exemplary embodiment, the formation of the trench structure comprises lining of the second trench with a dielectric structure which is configured at least partially as a gate dielectric, as well as formation of a gate electrode material in the second trench. The second trench is therefore used to receive a gate dielectric and a gate electrode. For example, the dielectric structure comprises a thermally grown and special deposited oxide, which may form the gate dielectric or a part thereof. Exemplary gate electrode materials include heavily doped semiconductor materials, for example polycrystalline silicon, as well as metals or conductive metal compounds.

According to one exemplary embodiment, the formation of the second trench in the semiconductor body comprises a dry etching process, and subsequently wet etching with an alkaline solution. The dry etching process is for example a physical dry etching method, a chemical dry etching method, or alternatively a physicochemical dry etching method such as reactive ion etching (RIE). The dry etching process may for example be used for the trench formation, while the wet etching process with an alkaline solution, for example an aqueous KOH or TMAH solution, is used to remove or reduce a taper, i.e. inclined trench side walls, formed during the dry etching. A perturbation of the charge balance in the SJ structure by a taper during the formation of the first trench is therefore counteracted.

According to one exemplary embodiment, the semiconductor body is enlarged after filling of the first trench by forming a semiconductor layer on the first side. The semiconductor layer may, for example, be adapted in terms of thickness and doping concentration to the requirements of a cell head above an SJ structure of the target semiconductor component.

According to one exemplary embodiment, a repetition of the method features A20, A30, A40 described in connection with FIG. 1 is carried out. In this way, a vertical extent of the SJ structure can be achieved by means of multiple epitaxy, so that a restriction of the vertical extent of the SJ structure by the maximum energy during the ion implantation can be overcome.

According to one exemplary embodiment, the second trench is formed less deeply into the semiconductor body than the first trench. The depth difference corresponds, for example, to a desired vertical extent of the SJ structure below a gate trench.

The exemplary embodiments above may be combined with one another in order to further refine the exemplary embodiment described with reference to FIG. 1.

Exemplary embodiments of a method for producing a semiconductor component will be explained in more detail with reference to the schematic cross-sectional views of a semiconductor body in FIGS. 2A to 2K.

Figure 2A:
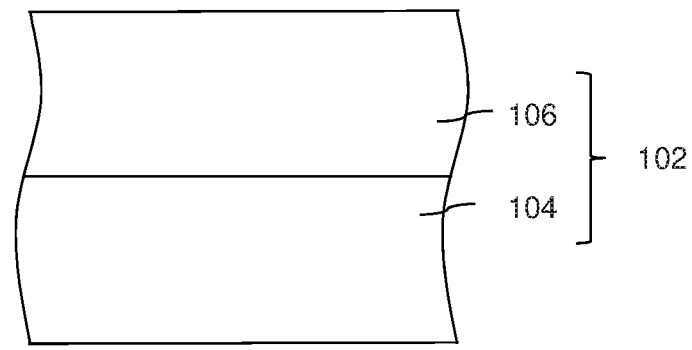
FIGS. 2A to 2K show schematic cross-sectional views of a semiconductor body for exemplary illustration of method features in connection with the flowchart of FIG. 1.

With reference to the schematic cross-sectional view in FIG. 2A, a semiconductor body 102 is provided which comprises a first dopant of a first conductivity type, for example boron. The semiconductor body 102 comprises a semiconductor substrate 104, as well as a first semiconductor layer 106 formed on the semiconductor substrate 104. The first semiconductor layer 106 may, for example, be formed by means of an epitaxial layer deposition method, for example chemical vapor deposition (CVD). The first dopant is, for example, present only in the first semiconductor layer 106. The first dopant may be introduced into the first semiconductor layer 106 of the semiconductor body 102 both in-situ, i.e. during the layer deposition, or alternatively by a plurality of ion implantations with different energy after the deposition of an e.g. intrinsic semiconductor layer. The first semiconductor layer 106 may also be constructed from a plurality of sublayers, for example an optional base layer at the boundary with the semiconductor substrate 104, a central layer into which the first dopant is introduced and which is used for the formation of an SJ structure, as well as a component head layer on the central layer, which is used for example to receive a component, which comprises for instance source and body regions. The component head layer may, for instance, also be defined in that, in a semiconductor layer deposited so that it is intrinsically or lightly doped, a lowest ion implantation energy for introduction of the first dopant defines a boundary between the still intrinsic or lightly doped component head layer and the central layer.

Besides the first dopant, a non-doping element, for example carbon, may also be introduced into the semiconductor layer 106 in order to counteract subsequent lateral outward diffusion of the first dopant. For example, carbon may be introduced into the semiconductor layer 106 by in-situ doping and/or one or more ion implantations.

Figure 2B:
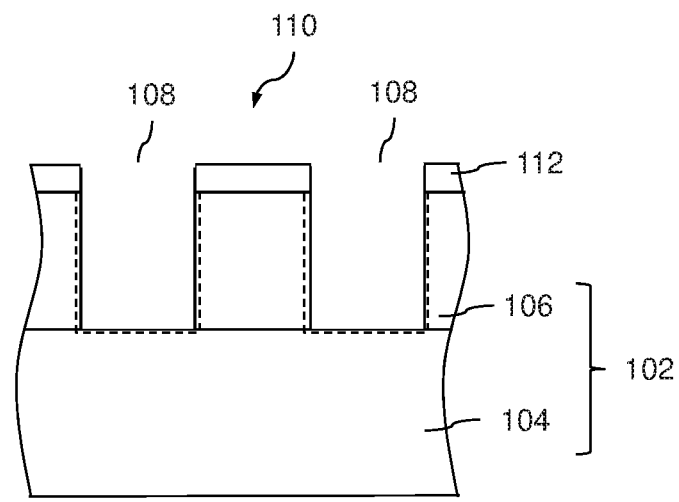

With reference to the schematic cross-sectional view in FIG. 2B, a first trench 108 is formed in the semiconductor body 102 starting from a first side 110 by means of a mask 112, for example an etching mask. The etching mask, for example a hard mask or a resist mask, may for example be formed by means of photolithographic structuring. The trench may, for example, be formed by means of a dry etching process such as RIE, as well as an optional wet etching process in an alkaline environment in order to reduce or eliminate a taper. The bottom of the first trench 108 ends, for example, at the transition to the semiconductor substrate 104, or alternatively inside the semiconductor layer 106 at a transition to a base layer. In order to counteract subsequent lateral outward diffusion of the first dopant, carbon may for example be introduced into the semiconductor layer 106 by means of one or more oblique implantations through side walls of the first trench 108. The introduction of carbon by means of oblique implantation(s) is illustrated by way of example in FIG. 2B by a dashed line.

Figure 2C:
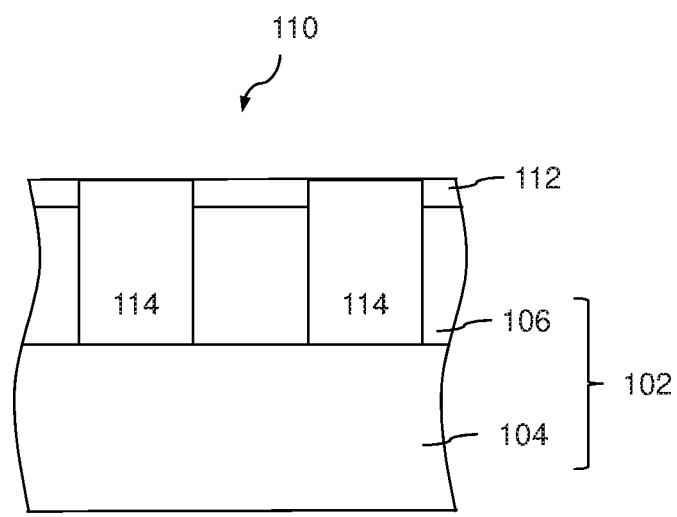

With reference to the schematic cross-sectional view in FIG. 2C, the first trench 108 is filled with a semiconductor filler material 114. The semiconductor filler material 114 may, for example, be produced by means of a layer deposition method such as chemical vapor deposition (CVD). For example, the first trench 108 is filled with the semiconductor filler material 114 by a method such as selective epitaxy, selective epitaxy allowing filling with a maximally high crystal quality, for example epitaxial growth on the side and bottom surfaces of the first trench 108. A total dopant concentration in the semiconductor filler material may, as an average value determined over a vertical extent of the first trench 108, be more than two, or more than three or even more than four orders of magnitude less than a total dopant concentration dominated by the first dopant in an area of the semiconductor body 102 located next to the first trench 108 in relation to the same vertical extent. The semiconductor filler material 114 may therefore be an intrinsic semiconductor filler material 114, i.e. one which is doped only by impurities but not deliberately, or a semiconductor filler material 114 which is lightly doped.

Figure 2D:
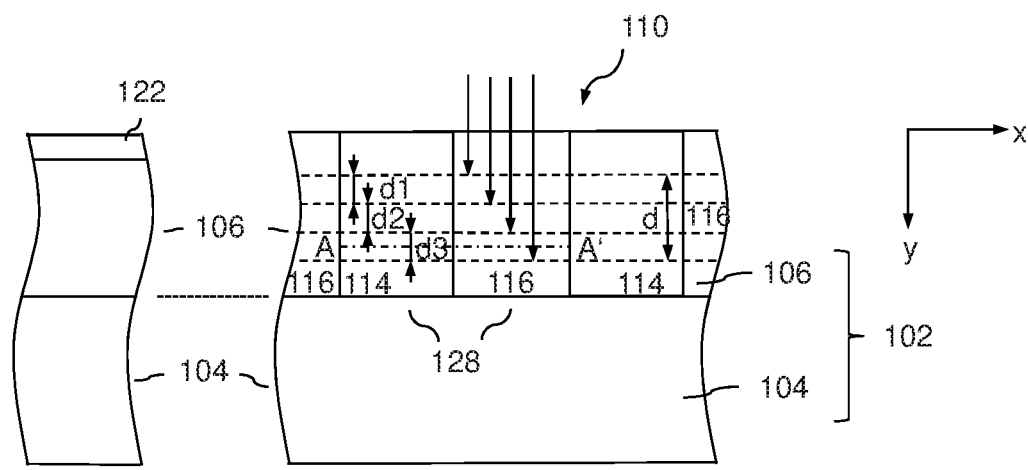

With reference to the schematic cross-sectional view in FIG. 2D, the mask 112 is removed and the semiconductor filler material 114 is partially reduced, for example as far as a lower side of the mask 112.

Furthermore with reference to the schematic cross-sectional view in FIG. 2D, a superjunction structure 128 is formed by introducing a second dopant of a second conductivity type into the semiconductor body 102, the second dopant partially compensating for a concentration of the first dopant in a first region 116 between neighboring semiconductor filler materials 114, and the semiconductor filler material 114 being doped with the second dopant. The SJ structure is therefore constructed from the semiconductor filler material 114, which has the second conductivity type and represents a second region 117, and from the first region 116, which has the first conductivity type and partial compensation of the doping. The first region 116 and the second region 117 may, for example, be arranged alternately along the first lateral direction.

According to one exemplary embodiment, a dose of the first dopant, measured along a segment AA' passing fully through the first region 116 and the second region 117 in a first lateral direction x, differs by at most 5% from a dose of the second dopant along the same segment AA'. The segment AA' is shown by way of example from the start of a column of the first dopant as far as the end of the column of the second dopant. The segment could equally well extend from half of a first column of the first dopant over the entire column of the second dopant and a further half of a column of the first dopant. The segment AA' thus stands in a representative manner for a full period of the periodicity of the superjunction structure along the alternately doped columns.

According to the exemplary embodiment illustrated in FIG. 2D, the second dopant is introduced into the semiconductor body by means of a multiplicity of ion implantations with different implantation energy. This is illustrated in FIG. 2D with the aid of arrows which end at different depths of the semiconductor body 102. For example, the second dopant is introduced into the semiconductor body 102 by a plurality of ion implantations with different implantation energies, in such a way that a vertical spacing d, d2, d3 of the neighboring implantation peaks in a vertical direction y lies in a range of from 100 nm to 400 nm. In this case, the spacings d1, d2, d3 may be different, or alternatively partially or entirely coincide. According to one exemplary embodiment, a maximum implantation energy and a minimum implantation energy are selected in such a way that a vertical spacing d of the associated implantation peaks lies in a range of from 1 µm to 3 µm. The implantation of the first dopant may, for example, be carried out with the same number of implantations as the implantation of the second dopant. Since the implantation energies for achieving a particular penetration depth depend on the dopant species, these energies may for example be adapted in such a way that the same penetration depths are achieved with the respective implantations.

According to the exemplary embodiment shown in FIG. 2D, the second dopant is introduced fully, i.e. without masking, through a surface of an active transistor cell area 118 by a plurality of ion implantations with different implantation energies. In this case, masking of the ion implantations may for example be carried out in a peripheral area 120 laterally adjacent to the transistor cell area 118, for example by means of a mask 122. Unmasked introduction of the second dopant in the transistor cell area 118 and masking in the peripheral area 120 may be applied in the same way to the introduction of the first dopant by ion implantations. Besides the second dopant, for example, carbon may additionally be introduced fully, i.e. without masking, through the surface of the active transistor cell area by one or more ion implantations.

Figure 2E:
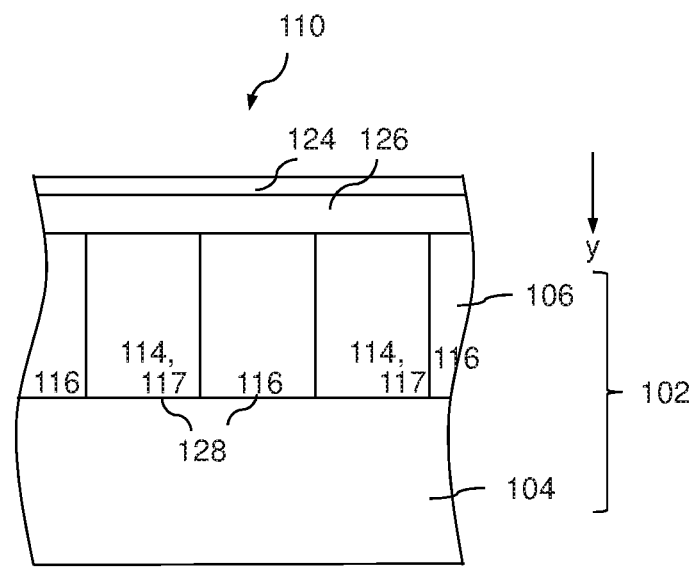

With reference to the schematic cross-sectional view in FIG. 2E a source region 124 is formed in the semiconductor body 102, for example by masked or unmasked ion implantation of a dopant of the second conductivity type. Likewise, a body region 126 is formed in the semiconductor body 102, for example by masked or unmasked ion implantation of a dopant of the first conductivity type.

With reference to the schematic cross-sectional view in FIG. 2F a second trench 130 is formed in the semiconductor body 102 by means of a photolithographically structured mask 132, for example an SiN mask, for example by a dry etching method and/or wet etching method, such as for instance described in connection with method feature A50 above. In this case, the second trench 130 extends less deeply into the semiconductor body 102 than the first trench formed previously and filled with the semiconductor filler material 114.

Figure 2F:
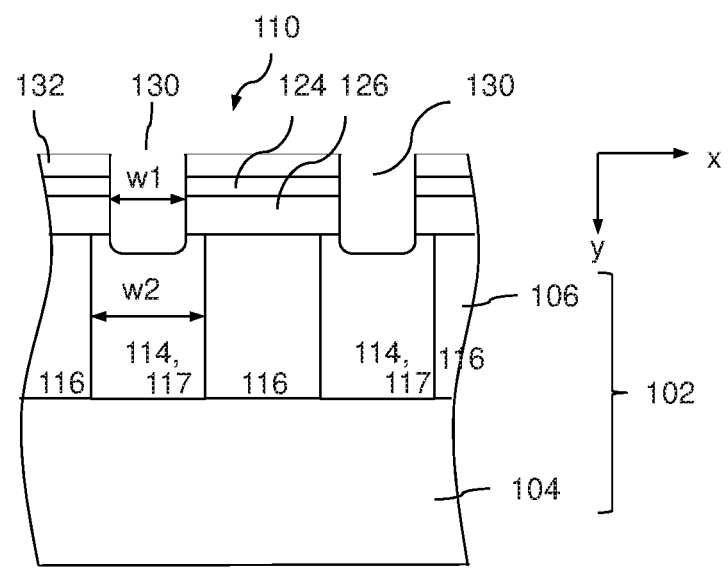

According to the exemplary embodiment represented in FIG. 2F, a width w1 of the second trench 130 along the first lateral direction x is less than a width w2 of the second trench 117 along the first lateral direction x. The semiconductor filler material 114 in the second region 117 may therefore adjoin side walls of the second trench 130. This allows a reliable channel connection to a drift zone during subsequent formation of a gate electrode structure in the second trench 130.

Figure 2G:
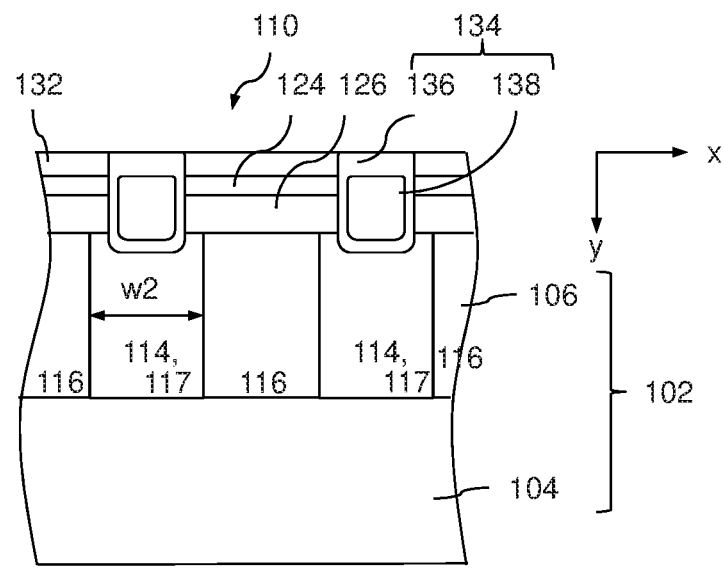

With reference to the schematic cross-sectional view in FIG. 2G a trench structure 134 is formed in the second trench 130. The trench structure 134 comprises a dielectric structure 136 as well as a gate electrode material 138, as for example explained above in connection with method feature A60.

Figure 2H:
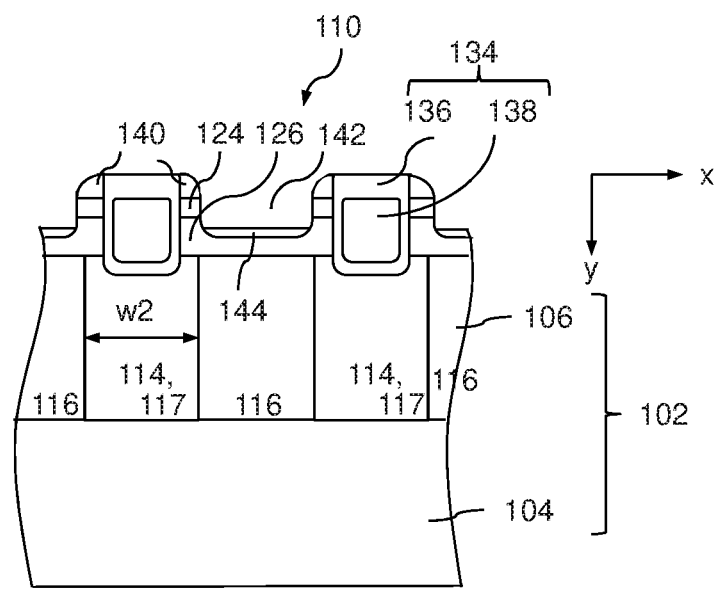

With reference to the schematic cross-sectional view in FIG. 2H the mask 132 is removed and a spacer 140 is formed, for example by layer deposition such as oxide deposition and subsequent spacer etching. The formation of the spacer 140 is followed by formation of a contact trench 142, for example by means of a dry etching process and/or a wet etching process. A heavily doped contact region 144 of the first conductivity type may be formed at the bottom of the contact trench 142, in order to allow low-ohmic electrical connection of the body region to a contact material.

Figure 2I:
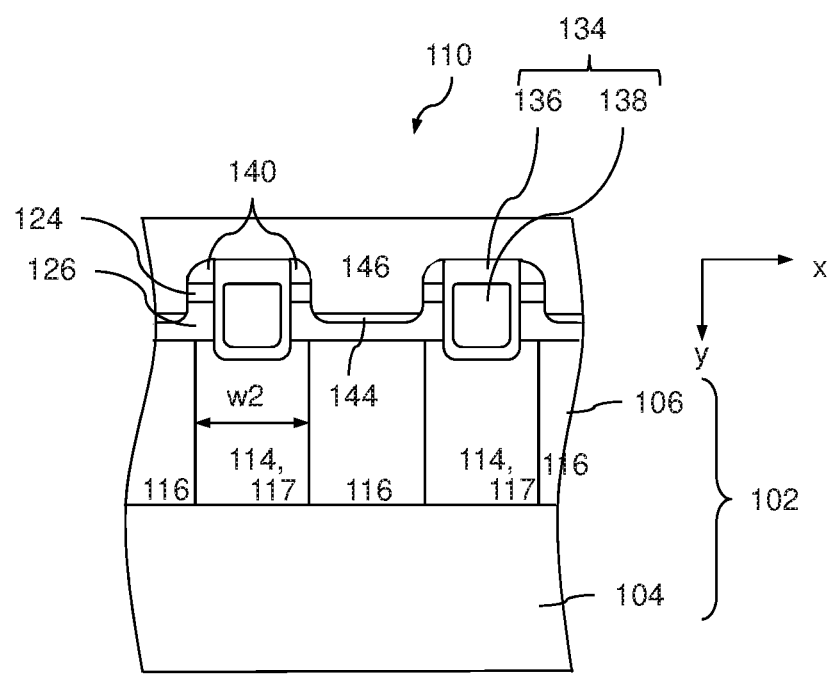

With reference to the schematic cross-sectional view in FIG. 2I, a contact material 146 for electrical contacting of the body region 126 is formed in the contact trench 142 via the heavily doped contact region 144, as well as for electrical contacting of the source region 124, and is continued as a wiring plane which, for example, may be structured in a further subsequent step.

Other conventional processing steps for manufacture of the semiconductor component follow, for example formation of further electrically insulated and conductive structures on the first side 110, as well as formation of a backside contact.

Of course, the sequence of method steps as shown in FIGS. 2A to 2I may also be modified in order to obtain a further exemplary embodiment of the method according to FIG. 1.

Figure 2J:
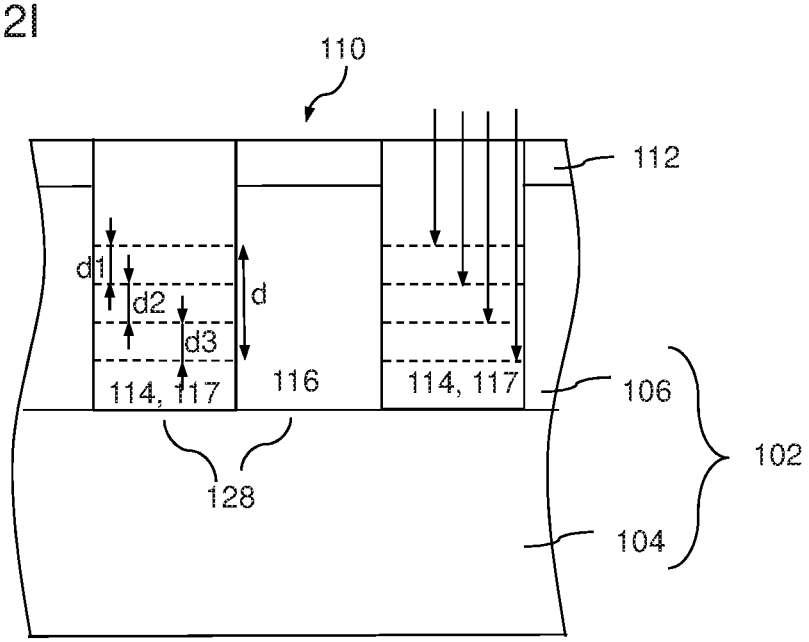
Figure 2K:
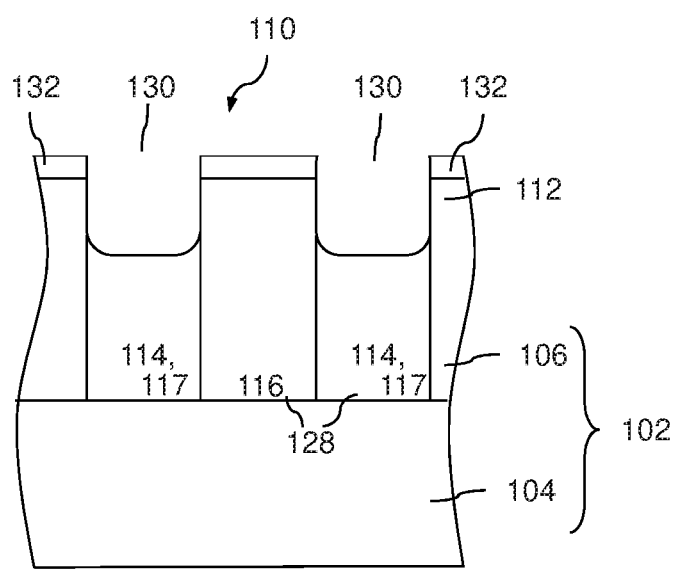

For example, with reference to the schematic cross-sectional view in FIG. 2J, the formation of the SJ structure 128 as well as the formation of the second trench 130 may also be carried out already at the method stage of FIG. 2C by the mask 112 being used as an implantation mark for introduction of the second dopant and as a mask, for example as an etching mask, during formation of the second trench 130, cf. FIG. 2K. The formation of the second trench 130 may be followed by the method steps shown in FIGS. 2G to 2I. The formation of the source region 124 as well as of the body region 126 may, for example, be carried out after removal of the mask 132 in FIG. 2G and before formation of the spacer 140.

Figure 3:
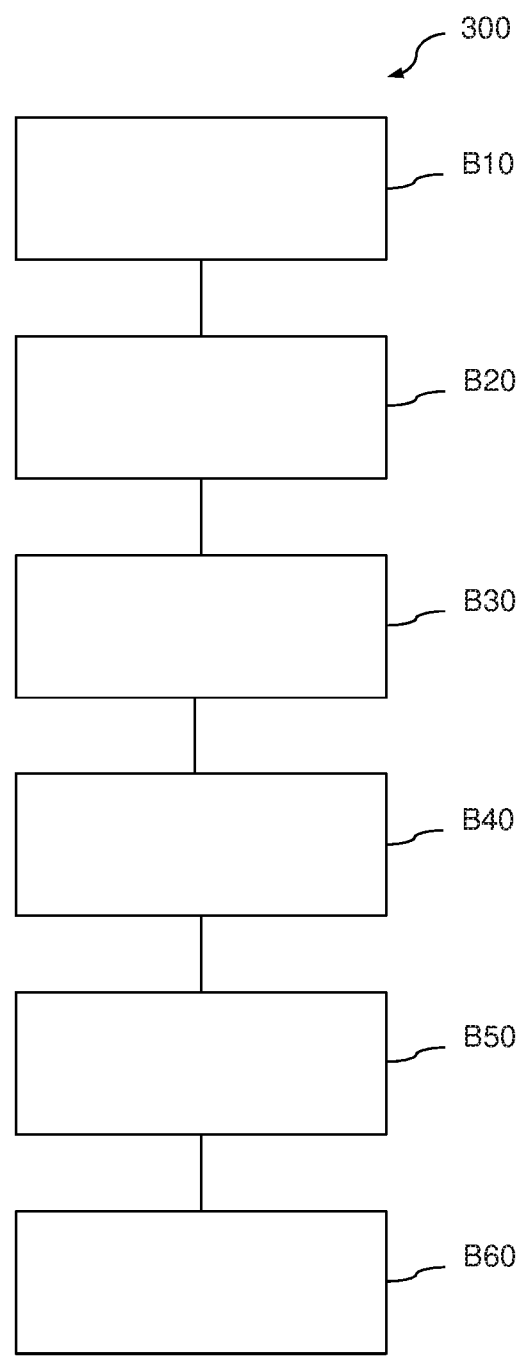
FIG. 3 shows a schematic flowchart to illustrate an exemplary method for producing a semiconductor component.

FIG. 3 represents a schematic flowchart 300 for the production of a semiconductor component according to one exemplary embodiment.

The flowchart 300 comprises method features which may respectively have one or more processing steps. During the production of the semiconductor component, further processing steps may follow, for example before, between or alternatively after the method features shown. Likewise, further processing steps may be carried out between the processing steps assigned to one method feature or alternatively together with the processing steps described. For example, a processing step, which is assigned to one method feature, of forming a trench by means of a mask, may comprise an etching process which forms both the trench described and further trenches defined by means of the mask. Also, processing steps of various method features may be carried out together or in a different order.

The comments made in connection with the exemplary embodiments above, cf. for example FIG. 1, regarding structural elements or process steps may be applied to corresponding structural elements and process steps in connection with the exemplary embodiments below.

A method feature B10 comprises formation of first trenches in a semiconductor body starting from a first side, a mesa region being arranged between two neighboring trenches.

A method feature B20 comprises formation of a trench structure in the first trenches.

A method feature B30 comprises formation of a mask on the semiconductor body on the first side.

A method feature B40 comprises implantation of a first dopant of the second conductivity type into the semiconductor body and through the mesa region by means of the mask, the dopant being implanted as far as a depth below the trench structure.

A method feature B50 comprises a heat treatment of the semiconductor body for lateral diffusion of the first dopant.

A method feature B60 comprises implantation of a second dopant of the first conductivity type into the semiconductor body and through the mesa region by means of the mask, the dopant being implanted as far as a depth below the trench structure.

Both the first and the second dopants may, as is described in connection with the flowchart 100, be introduced into the semiconductor body by a multiplicity of implantations with different energy. The introduction of the first dopant and of the second dopant may be carried out through the same mask.

Method features relating to the flowchart 300 will be explained in more detail by way of example with the aid of the cross-sectional views in in FIGS. 4A to 4F.

Figure 4A:
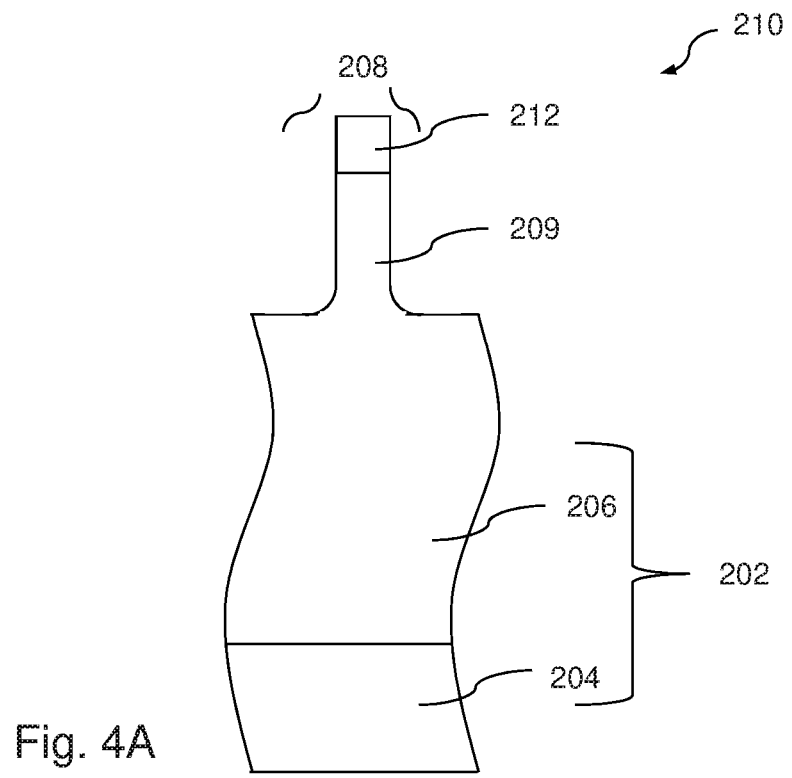
FIGS. 4A to 4F show schematic cross-sectional views of a semiconductor body for exemplary illustration of method features in connection with the flowchart of FIG. 3.

With reference to the schematic cross-sectional view in FIG. 4A, first trenches 208 are formed in a semiconductor body 202 starting from a first side 210, a mesa region 209 being arranged between two neighboring trenches 208. The semiconductor body 202 comprises, for example, a semiconductor layer 206 on a semiconductor substrate 204. The semiconductor layer 206 is for example produced on the semiconductor substrate 204 by an epitaxial deposition method such as CVD, and is for example less heavily doped than the semiconductor substrate 204. The exemplary details indicated above in connection with method feature A10 apply accordingly. A first mask 212, for example a SiN mask, is used for formation of the first trenches 208.

Figure 4B:
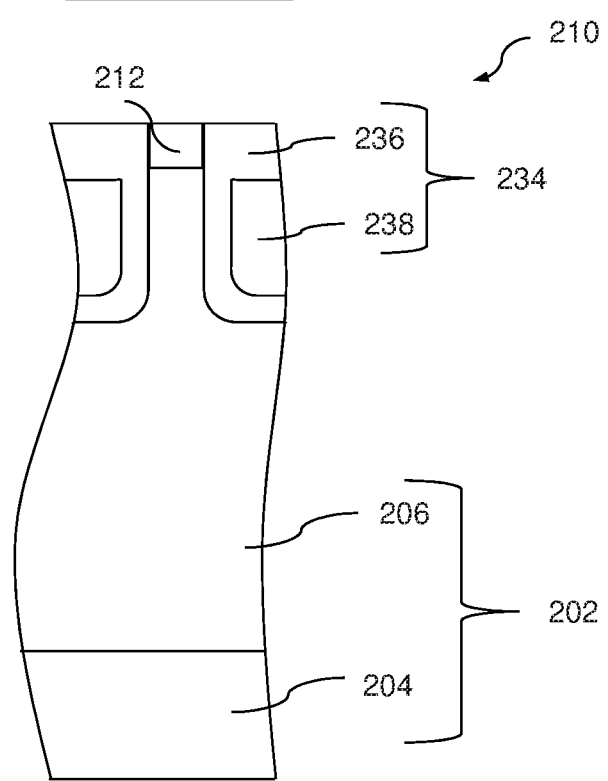

With reference to the schematic cross-sectional view in FIG. 4B, a trench structure 234 is formed in the first trenches 208. The trench structure 234 comprises a dielectric structure 236 as well as a gate electrode material 238. The exemplary details indicated above in connection with method feature A60 apply accordingly.

Figure 4C:
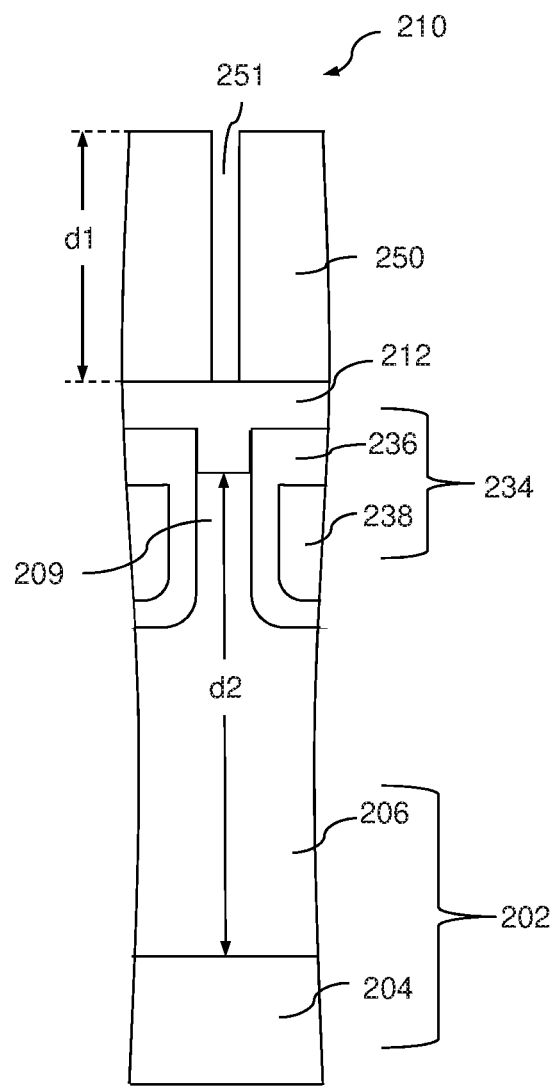

With reference to the schematic cross-sectional view in FIG. 4C, a second mask 250 is formed on the semiconductor body 202 on the first side 210. The second mask comprises for example silicate glass (SG), for example BSG (borosilicate glass), TEOS (tetraethyl orthosilicate), polycrystalline or amorphous silicon, carbon or a combination thereof. According to one exemplary embodiment, the second mask 250 has an aspect ratio of an opening 251 of more than 1:5, or even more than 1:10. For example, a thickness, i.e. a vertical extent dl, of the second mask 250 is more than a thickness d2 of the semiconductor layer 206.

Figure 4D:
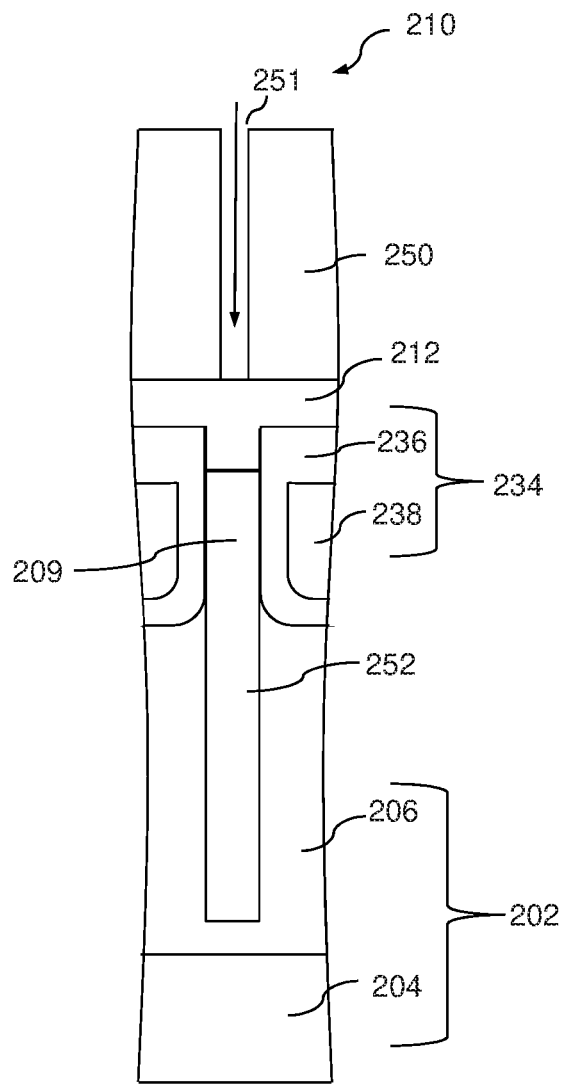

With reference to the schematic cross-sectional view in FIG. 4D, a first dopant of the second conductivity type, for example phosphorus, is implanted into the semiconductor body 202 and through the mesa region 209 by means of the opening 251 in the second mask 250, the first dopant being implanted as far as a depth below the trench structure 234, for example by a multiplicity of implantations with different energy, as is explained in more detail above in connection with method feature A40 and is represented schematically in FIG. 2D. The first dopant is initially present in a region 252 below the mesa region 209.

Figure 4E:
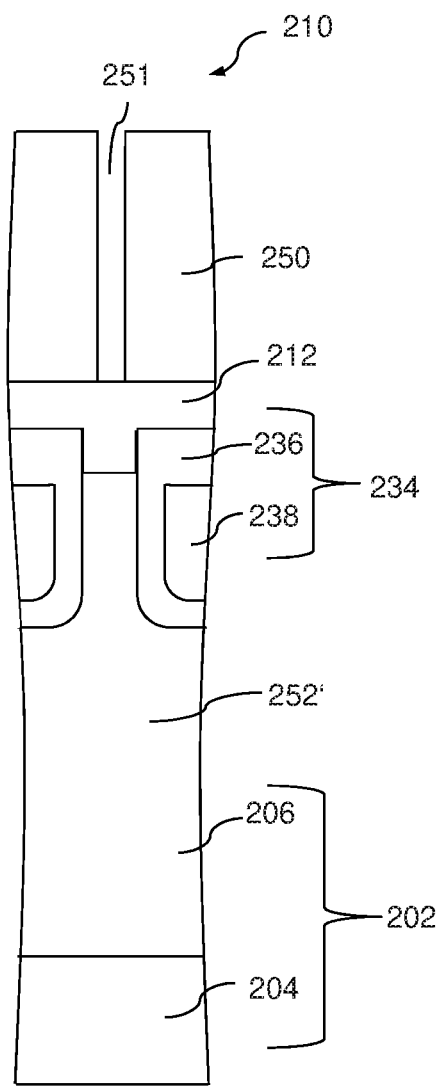

With reference to the schematic cross-sectional view in FIG. 4E, a heat treatment of the semiconductor body 202 for lateral diffusion of the first dopant is carried out. As a result of this, a widened region 252' of the second conductivity type is formed from the region 252.

With reference to the schematic cross-sectional view in FIG. 4F, a second dopant of the first conductivity type, for example boron, is implanted into the semiconductor body 202 and through the mesa region 209 by means of the opening 251 in the second mask 250, the second dopant being implanted as far as a depth below the trench structure 234, for example by a multiplicity of implantations with different energy, as is explained in more detail above in connection with method feature A40 and is represented schematically in FIG. 2D. The second dopant defines a first region 216 of an SJ structure 228, which region is of the first conductivity type and experiences partial compensation of the doping because of the first dopant of the second conductivity type present in the first region 216. The first region 216 is adjoined by a second region 217, which lies in the widened region 252' and is of the second conductivity type. The first region 216 and the second region 217 form the SJ structure 218 below a bottom of the trench structure 234.

In the first region 216, for example on average, for example averaged along a lateral extent of the respective regions in the first lateral direction x, there is a degree of doping compensation of the second dopant by the first dopant which is greater than the degree of compensation of the first dopant by the second dopant in the second region 217.

Figure 4F:
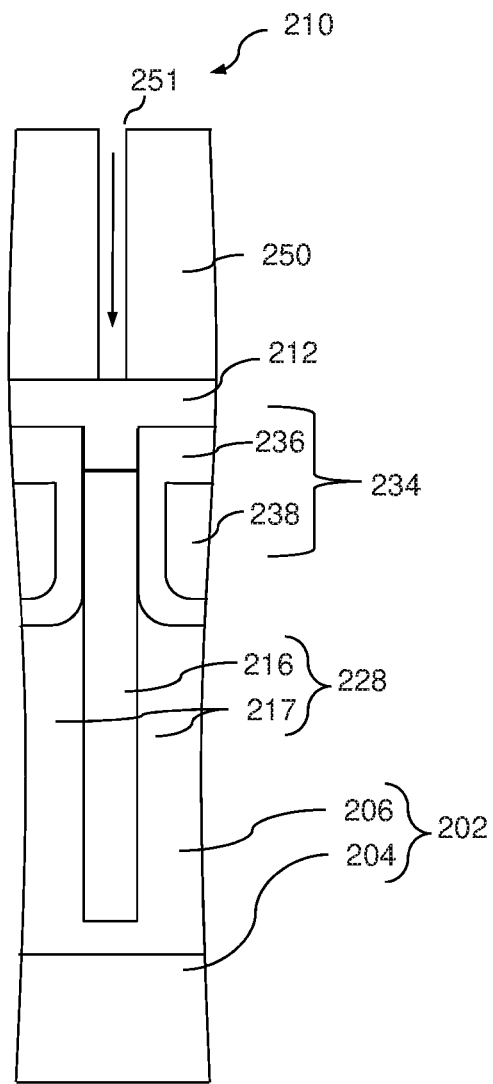

The method stage shown in FIG. 4F is followed by further processes for manufacture of the semiconductor component, for example removal of the second mask 250 and removal of the first mask 212, as well as formation of a contact material for electrical contacting of the body region as well as for electrical contacting of the source region, as explained for example with the aid of the process steps illustrated in FIGS. 2H and 2I.

Figure 5:
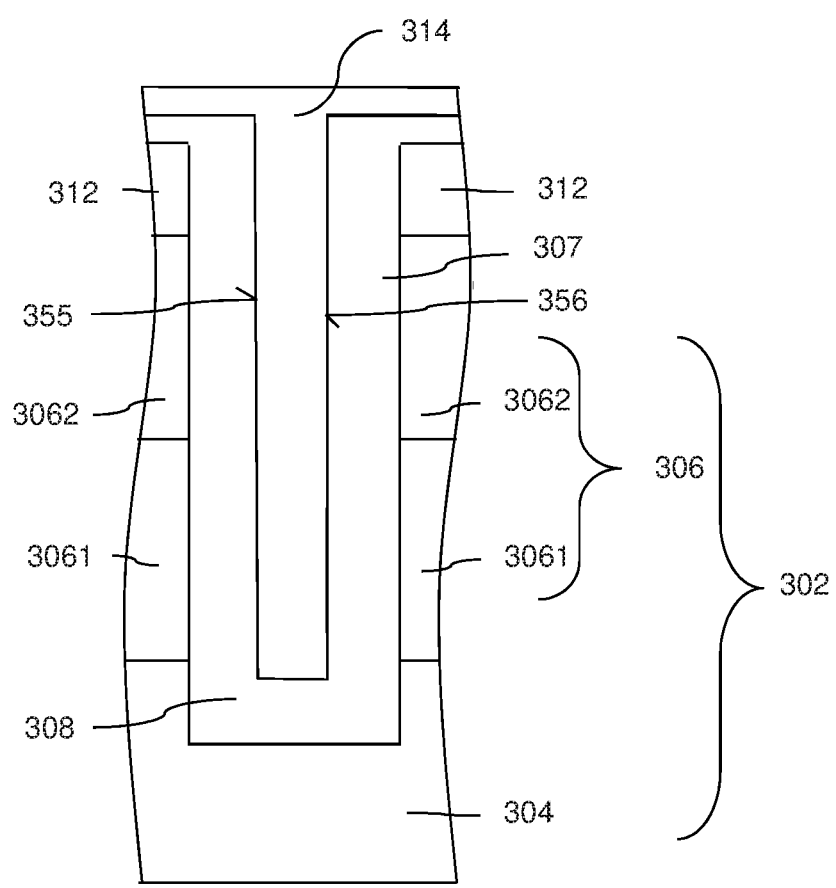
FIGS. 5, 6A, 6B, 7 and 8 show respective schematic cross-sectional views of a semiconductor body for illustration of exemplary embodiments of methods for producing a semiconductor component.

FIG. 5 shows a further exemplary embodiment, in which the process steps A10 to A40 are carried out in a modified form.

One exemplary embodiment of a method for producing a semiconductor component comprises provision of a semiconductor body 302, which comprises a semiconductor layer 306 on a semiconductor substrate 304. The semiconductor layer 306 may consist of sublayers of different conductivity type and/or dopant concentration, as is illustrated in FIG. 5 by means of the two sublayers 3061, 3062, or alternatively of a single semiconductor layer which is deposited to be intrinsic or slightly doped. Subdivision of the semiconductor layer 306 into sublayers of different conductivity type and/or dopant concentration allows deliberate influencing of the charge equilibrium of the SJ structure and shifting of the charge equilibrium to an excess of p-doping (so-called p-loading) or n-doping (so-called n-loading) as a function of a depth in the semiconductor substrate 306. The method furthermore comprises formation of a trench 308 in the semiconductor body 302, for example by means of an etching mask 312, as well as lining of the trench 308 with a semiconductor lining layer 307 which comprises first dopants of a first conductivity type and second dopants of a second conductivity type. The method furthermore comprises filling of the trench with a semiconductor filler material 314, which is arranged between a first side wall section 355 and a second side wall section 356 of the semiconductor lining layer, as well as formation of a superjunction layer by introducing some of the first dopants from the first and second side wall sections 355, 356 of the semiconductor lining layer 307 into the semiconductor filler material 314.

By different diffusion of the first and second dopants from the semiconductor lining layer into the filling material, which results for example from different penetration depths/penetration rates of the first and second dopants for the same thermal budget, a superjunction structure may be configured with alternately doped columns lying close to one another. The semiconductor body may be constructed from a plurality of sublayers before the diffusion step, the sublayer 3061 for example having a low concentration of the first dopant and the second sublayer 3062 having a low concentration of the second dopant, and therefore form a trapezoidal net doping profile.

According to one exemplary embodiment, the method furthermore comprises formation of a first trench gate structure and a second trench gate structure above the superjunction structure, the first trench gate structure overlapping with a vertical extension of the first side wall section, and the second trench gate structure overlapping with a vertical extension of the second side wall section. In this way, effective pitch doubling may be achieved.

According to one exemplary embodiment, a lateral center-to-center spacing between the first side wall section and the second side wall section coincides with a lateral center-to-center spacing between the first trench gate structure and the second trench gate structure.

According to one exemplary embodiment, the semiconductor body provided comprises a doped semiconductor substrate and, thereon, a semiconductor layer stack which is doped more lightly compared with the semiconductor substrate, and the trench is formed through the semiconductor layer stack at least as far as the semiconductor substrate.

According to one exemplary embodiment, the first dopants correspond to boron and the second dopants correspond to arsenic.

According to one exemplary embodiment, the semiconductor component is formed as a field effect transistor having a channel conductivity of the second conductivity type.

According to one exemplary embodiment, the semiconductor layer stack comprises a first semiconductor layer of the first conductivity type and a second semiconductor layer of the second conductivity type.

According to one exemplary embodiment, after the filling of the trench with the semiconductor filler material, at least one third semiconductor layer is formed on the semiconductor body, and a source region and a body region are formed in the third semiconductor layer.

According to one exemplary embodiment, a diffusion coefficient of the first dopants in the semiconductor body is greater than a diffusion coefficient of the second dopants in the semiconductor body, and the formation of the superjunction structure comprises a thermal diffusion process by which more first than second dopants diffuse from the first and second side wall sections into the semiconductor filler material, so that the semiconductor filler material is at least partially of the first conductivity type and the first and second side wall sections are at least partially of the second conductivity type.

According to one exemplary embodiment, a dose, introduced into the semiconductor lining layer, of the first dopants differs by at most 5% from a dose, introduced into the first semiconductor layer, of second dopants.

According to one exemplary embodiment, the first and the second dopants are introduced into the semiconductor lining layer by means of in-situ doping.

According to one exemplary embodiment, an aspect ratio of the trench lies in a range of from 1:2 to 1:10.

According to one exemplary embodiment, a depth of the trench lies in a range of from 1 µm to 5 µm.

According to one exemplary embodiment, an in-situ dopant concentration of the semiconductor filler material is at least two orders of magnitude less than an in-situ dopant concentration of the second dopants in the semiconductor lining layer.

According to one exemplary embodiment, the semiconductor lining layer is removed from a part of the bottom of the trench.

One exemplary embodiment of a semiconductor component comprises a first and a second trench gate structure, which extend from a first surface into a semiconductor body. The semiconductor component furthermore comprises a superjunction structure, a vertical extension of a mesa region between the first trench gate structure and the second trench gate structure overlapping at least partially with a first superjunction semiconductor region of a first conductivity type, and vertical extensions of the first gate structure and of the second gate structure respectively overlapping at least partially with a second superjunction semiconductor region of a second conductivity type, the first and second superjunction semiconductor regions being arranged alternately along a lateral direction. The first superjunction semiconductor region comprises first dopants of the first conductivity type and second dopants of the second conductivity type, the first dopants partially compensating for the second dopants, and a dopant concentration profile of the first dopants along the lateral direction having a maximum in a middle of the second superjunction semiconductor region.

According to one exemplary embodiment, the first and second dopants correspond to one of the pairs boron and arsenic, boron and antimony, gallium and arsenic, gallium and antimony.

According to one exemplary embodiment, the first superjunction semiconductor region is electrically connected by means of a body region of the first conductivity type to the first surface, and the superjunction semiconductor region of the second conductivity type is electrically connected by means of a drift zone of the second conductivity type to a second surface, lying opposite the first surface, of the semiconductor body.

According to one exemplary embodiment, a dopant concentration profile of the second dopants along the lateral direction has a maximum in the middle of the second superjunction semiconductor region.

According to one exemplary embodiment, a dopant concentration profile of the first dopants along the lateral direction has a minimum in a middle of the first superjunction semiconductor region.

According to one exemplary embodiment, a dopant concentration profile of the first dopants along the lateral direction at a pn junction between the first superjunction semiconductor region and the second superjunction semiconductor region decreases from the second superjunction semiconductor region to the first superjunction semiconductor region.

Figure 6A:
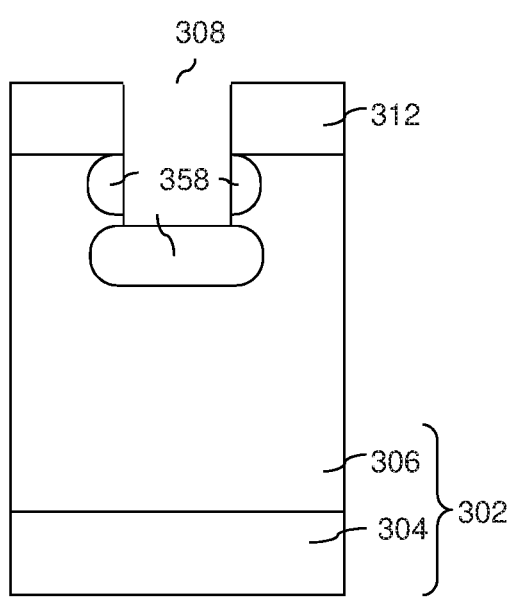
Figure 6B:
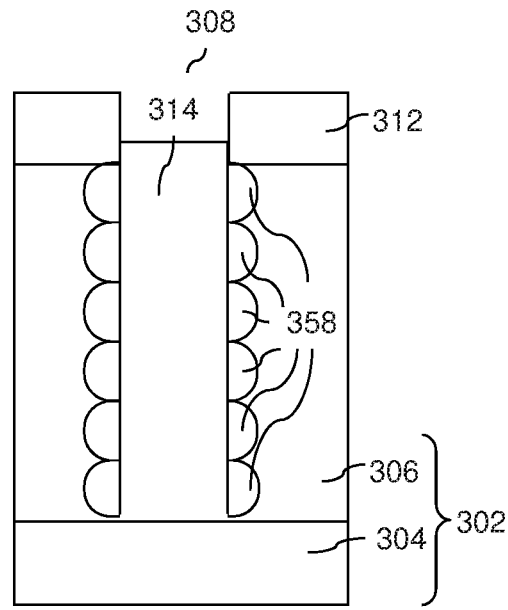

As an alternative to the method described in FIG. 5, the dopants may also be brought into the edge areas of the trench by means of stepwise implantation. The introduction of the semiconductor lining layer 307 of FIG. 5 accordingly brought about by implantation of dopants of the first and second types at the side edge of the trenches, as can be seen in FIGS. 6A and 6B in the form of the implanted doped regions 358. In this case, the doped regions 358 are stacked in a vertical direction by a succession of implantations and deepenings of the trench 308. During the deepening of the trench 308, for example carried out by one or more etching steps, some of the dopants previously introduced by implantation are removed again.

The trench may subsequently be filled with filler material 314, for example with undoped silicon, and a superjunction structure having alternately doped columns lying close to one another may be formed by thermal diffusion.

One exemplary embodiment comprises a method for producing a semiconductor component. The method comprises provision of a semiconductor body, which comprises a trench, a first semiconductor body area respectively being formed on opposite side walls of the trench. The first semiconductor body area comprises first dopants of a first conductivity type and second dopants of a second conductivity type, in a higher concentration than in a second semiconductor body area laterally adjacent to the first semiconductor body area. The method furthermore comprises filling of the first trench with a semiconductor filler material, which is arranged between the opposite side walls of the trench. The method furthermore comprises formation of a superjunction structure by introducing some of the first dopants from the first semiconductor body area into the semiconductor filler material.

According to one exemplary embodiment, the provision of the semiconductor body comprises:
i) formation of a mask having a mask opening on the semiconductor body;
ii) introduction of the first dopants into the semiconductor body through the mask opening;
iii) introduction of the second dopants into the semiconductor body through the mask opening;
iv) formation of a recess in the semiconductor body below the mask opening;
v) repetition of steps ii) to iv) at least once, so that the trench is formed by the recesses and the first semiconductor body area is bounded by the introduced first and second dopants.

Figure 7:
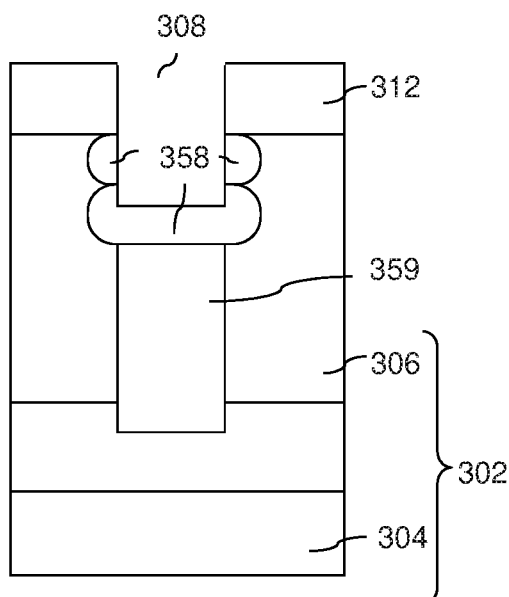

According to one exemplary embodiment, after step i) and before step ii), the method furthermore comprises formation of a trench in the semiconductor body below the mask opening, as well as filling of the trench with a filler. This exemplary embodiment is represented by way of example in the schematic cross-sectional view in FIG. 7, the filler being denoted by the reference 359. A material of the filler may, for example, the selected with a view to precise formation of the recesses by an etching process.

According to one exemplary embodiment, the filler comprises one or more of the materials resist, oxide, silicon nitride, epitaxial or amorphous silicon-germanium, carbon, oxide lining of the trench with amorphous or polycrystalline silicon filler.

According to one exemplary embodiment, the first dopants and the second dopants are introduced into the semiconductor body by an ion implantation process.

According to one exemplary embodiment, an implantation dose of the first dopants differs by at most 5% from an implantation dose of the second dopants.

One exemplary embodiment of a method for producing a semiconductor component comprises provision of a semiconductor body which comprises a trench, a first semiconductor body area respectively being formed on opposite side walls of the trench, which area comprises first dopants of a first conductivity type and second dopants of a second conductivity type, in a higher concentration than in a second semiconductor body area laterally adjacent to the first semiconductor body area. The method furthermore comprises filling of the first trench with a semiconductor filler material, which is arranged between the opposite side walls of the trench, as well as formation of a superjunction structure by introducing some of the first dopants from the first semiconductor body area into the semiconductor filler material.

Figure 8:
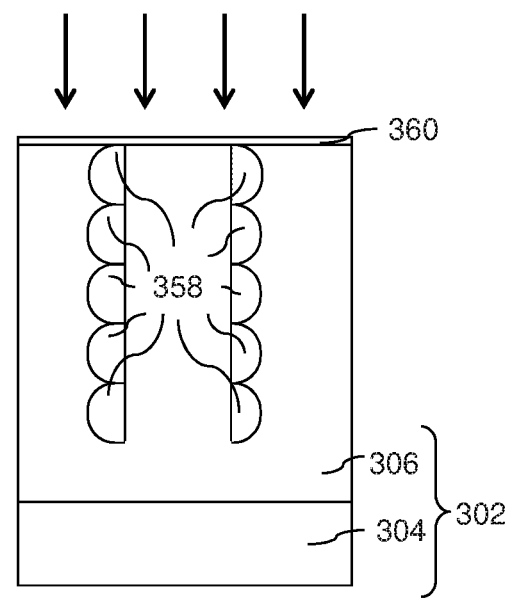

It is furthermore possible to combine the possibilities presented above for the formation of the superjunction structure. For example, the introduction of dopants through the trench, as shown in FIG. 6A, may be restricted to dopants of one type, for example of the first type. After the filling of the trench with undoped semiconductor material, for example silicone, subsequent implantation of the second dopant may be carried out over the entire surface, as is shown in FIG. 8. The implantation may be carried out through a scattering layer 360, for example a scattering oxide.

Other processing steps for manufacture of the semiconductor component follow, for example formation of a semiconductor component head layer, method features A50, A60, formation of further electrically insulating and conductive structures on the first side, as well as formation of a backside contact.

Although specific embodiments have been illustrated and described herein, persons skilled in the art will understand that the specific embodiments shown and described may be replaced by many alternative and/or equivalent configurations, without departing from the protective scope of the invention. The application is intended to include any adaptations or variants of the specific embodiments discussed herein. The invention is therefore restricted only by the claims and their equivalents.

What is claimed is:

1. A method for producing a semiconductor component, the method comprising:
    providing a semiconductor body having a first dopant of a first conductivity type;
    forming a first trench in the semiconductor body starting from a first side;
    filling the first trench with a semiconductor filler material;
    forming a superjunction structure by introducing a second dopant of a second conductivity type into the semiconductor body, the semiconductor filler material being doped with the second dopant;
    forming a second trench in the semiconductor body starting from the first side; and
    forming a trench structure in the second trench,
    wherein forming the trench structure comprises:
        lining the second trench with a dielectric structure which is configured at least partially as a gate dielectric; and
        forming a gate electrode material in the second trench.

2. The method of claim 1, wherein the second dopant partially compensates for a concentration of the first dopant.

3. The method of claim 1, wherein the first dopant is introduced into the semiconductor body by a plurality of ion implantations with different implantation energies or by in-situ doping.

4. The method of claim 3, wherein the first dopant is introduced into the semiconductor body by the plurality of ion implantations with different implantation energies, such that a spacing of neighboring implantation peaks in a vertical direction lies in a range of 100 nm to 400 nm.

5. The method of claim 3, wherein a maximum implantation energy and a minimum implantation are selected such that a vertical spacing of the associated implantation peaks lies in a range of 1 μm to 3 μm.

6. The method of claim 3, further comprising:
    introducing a non-doping element into the semiconductor body in addition to the first dopant, the non-doping element being configured to reduce diffusion of the first dopant due to a thermal budget.

7. The method of claim 6, wherein the non-doping element is carbon.

8. The method of claim 7, wherein the carbon is introduced into the semiconductor body by in-situ doping or by one or more ion implantations.

9. The method of claim 1, wherein the second dopant is introduced fully without masking, through a surface of an active transistor cell area by a plurality of ion implantations with different implantation energies.

10. The method of claim 1, wherein the first dopant is introduced fully without masking, through a surface of an active transistor cell area by a plurality of ion implantations with different implantation energies.

11. The method of claim 1, further comprising:
introducing carbon fully without masking, through a surface of an active transistor cell area by one or more ion implantations.

12. The method of claim 1, wherein the superjunction structure comprises a first region of the first conductivity type, in which there is partial compensation for the doping of the first dopant by the second dopant, and a neighboring second region of the second conductivity type, which comprises the semiconductor filler material and is doped with the second dopant, and wherein a dose of the first dopant along a segment differs by at most 5% from a dose of the second dopant along the same segment, the segment passing fully through the first region and the second region in a first lateral direction.

13. The method of claim 12, wherein a width of the second trench along the first lateral direction is less than a width of the second region along the first lateral direction.

14. The method of claim 1, wherein forming the second trench in the semiconductor body comprises:
a dry etching process; and
after the dry etching process, wet etching with an alkaline solution.

15. The method of claim 1, further comprising:
enlarging the semiconductor body by forming a semiconductor layer on the first side after filling the first trench.

16. The method of claim 1, wherein the second trench is formed less deeply into the semiconductor body than the first trench.

17. A method for producing a semiconductor component, the method comprising:
providing a semiconductor body having a first dopant of a first conductivity type;
forming a first trench in the semiconductor body starting from a first side;
filling the first trench with a semiconductor filler material;
forming a superjunction structure by introducing a second dopant of a second conductivity type into the semiconductor body, the semiconductor filler material being doped with the second dopant;
forming a second trench in the semiconductor body starting from the first side; and
forming a trench structure in the second trench,
wherein the first dopant is introduced into the semiconductor body by a plurality of ion implantations with different implantation energies,
wherein a spacing of neighboring implantation peaks in a vertical direction lies in a range of 100 nm to 400 nm and/or a maximum implantation energy and a minimum implantation energy are selected such that a vertical spacing of the associated implantation peaks lies in a range of 1 μm to 3 μm.

18. A method for producing a semiconductor component, the method comprising:
providing a semiconductor body having a first dopant of a first conductivity type;
forming a first trench in the semiconductor body starting from a first side;
filling the first trench with a semiconductor filler material;
forming a superjunction structure by introducing a second dopant of a second conductivity type into the semiconductor body, the semiconductor filler material being doped with the second dopant;
forming a second trench in the semiconductor body starting from the first side; and
forming a trench structure in the second trench,
wherein at least one of the first dopant and the second dopant is introduced fully without masking, through a surface of an active transistor cell area by a plurality of ion implantations with different implantation energies.

19. A method for producing a semiconductor component, the method comprising:
providing a semiconductor body having a first dopant of a first conductivity type;
forming a first trench in the semiconductor body starting from a first side;
filling the first trench with a semiconductor filler material;
forming a superjunction structure by introducing a second dopant of a second conductivity type into the semiconductor body, the semiconductor filler material being doped with the second dopant;
forming a second trench in the semiconductor body starting from the first side;
forming a trench structure in the second trench; and
introducing carbon fully without masking, through a surface of an active transistor cell area by one or more ion implantations.

20. A method for producing a semiconductor component, the method comprising:
providing a semiconductor body having a first dopant of a first conductivity type;
forming a first trench in the semiconductor body starting from a first side;
filling the first trench with a semiconductor filler material;
forming a superjunction structure by introducing a second dopant of a second conductivity type into the semiconductor body, the semiconductor filler material being doped with the second dopant;
forming a second trench in the semiconductor body starting from the first side; and
forming a trench structure in the second trench,
wherein the superjunction structure comprises a first region of the first conductivity type, in which there is partial compensation for the doping of the first dopant by the second dopant, and a neighboring second region of the second conductivity type, which comprises the semiconductor filler material and is doped with the second dopant,
wherein a dose of the first dopant along a segment differs by at most 5% from a dose of the second dopant along the same segment, the segment passing fully through the first region and the second region in a first lateral direction.

21. The method of claim 20, wherein a width of the second trench along the first lateral direction is less than a width of the second region along the first lateral direction.

* * * * *